(12) United States Patent
Dougherty et al.

(10) Patent No.: US 9,543,174 B1
(45) Date of Patent: Jan. 10, 2017

(54) CASSETTE CONFIGURATIONS TO SUPPORT PLATTERS HAVING DIFFERENT DIAMETERS

(71) Applicant: Seagate Technology LLC, Cupertino, CA (US)

(72) Inventors: David V. Dougherty, Campbell, CA (US); Ian J. Beresford, Milpitas, CA (US); Donald E. Curtiss, Morgan Hill, CA (US); Thomas Y. Chang, Menlo Park, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/834,041

(22) Filed: Aug. 24, 2015

Related U.S. Application Data

(62) Division of application No. 14/267,673, filed on May 1, 2014, now Pat. No. 9,117,863.

(60) Provisional application No. 61/824,263, filed on May 16, 2013.

(51) Int. Cl.
| | |
|---|---|
| *A47G 19/08* | (2006.01) |
| *H01L 21/673* | (2006.01) |
| *B65D 85/38* | (2006.01) |
| *B65D 25/10* | (2006.01) |
| *H01L 21/67* | (2006.01) |

(52) U.S. Cl.
CPC ....... *H01L 21/67313* (2013.01); *B65D 25/107* (2013.01); *B65D 85/38* (2013.01); *H01L 21/67326* (2013.01); *H01L 21/67* (2013.01)

(58) Field of Classification Search
CPC ............... H01L 21/67; H01L 21/67313; H01L 21/67326; B65D 85/38; B65D 25/107

USPC   211/41.18, 41.17, 26, 26.2, 41.12; 206/832, 710, 711
See application file for complete search history.

(56) References Cited

U.S. PATENT DOCUMENTS

| | | | | |
|---|---|---|---|---|
| 4,520,925 | A | * | 6/1985 | Johnson ............... B65D 25/107 206/454 |
| 4,721,207 | A | * | 1/1988 | Kikuchi ............... B65D 25/107 206/204 |
| 4,872,554 | A | * | 10/1989 | Quernemoen .... H01L 21/67316 118/500 |
| RE33,361 | E | * | 10/1990 | Coe ....................... B65D 21/022 206/308.3 |
| 5,468,297 | A | * | 11/1995 | Letort ..................... C30B 31/14 118/728 |
| 5,538,385 | A | | 7/1996 | Bacchi et al. |
| 5,873,468 | A | * | 2/1999 | Ejima ............... H01L 21/67393 206/454 |

(Continued)

*Primary Examiner* — Joshua J Michener
*Assistant Examiner* — Devin Barnett
(74) *Attorney, Agent, or Firm* — Hall Estill Attorneys at Law

(57) ABSTRACT

A material handling apparatus adapted to support a plurality of disc-shaped platters, such as but not limited to a cassette assembly adapted to support data recording media or substrates during manufacturing. In some embodiments, a cassette assembly includes a base cassette with a base and opposing sidewalls configured to support an outermost perimeter of each of a first plurality of disc-shaped platters having a first diameter. An insert contactingly engages the base cassette. The insert has a plurality of spaced apart grooves to contactingly support an outermost perimeter of each of a second plurality of disc-shaped platters having a different, second diameter.

15 Claims, 9 Drawing Sheets

(56) References Cited

U.S. PATENT DOCUMENTS

| | | | |
|---|---|---|---|
| 5,921,397 A * | 7/1999 | Whalen | B65D 25/107 |
| | | | 206/454 |
| 6,010,008 A * | 1/2000 | Nyseth | H01L 21/67369 |
| | | | 206/454 |
| 6,036,031 A * | 3/2000 | Ishikawa | G11B 33/0444 |
| | | | 118/500 |
| 6,079,557 A | 6/2000 | Lammerant et al. | |
| 6,190,118 B1 | 2/2001 | Allen et al. | |
| 6,216,874 B1 * | 4/2001 | Bores | H01L 21/67379 |
| | | | 206/454 |
| 6,230,891 B1 * | 5/2001 | Usui | G11B 33/045 |
| | | | 206/303 |
| 6,427,850 B2 | 8/2002 | Mendiola | |
| 6,428,729 B1 * | 8/2002 | Bhatt | G03F 7/70691 |
| | | | 264/254 |
| 6,615,994 B2 * | 9/2003 | Cu, Jr. | H01L 21/6732 |
| | | | 118/500 |
| 6,691,876 B2 * | 2/2004 | Tsai | H01L 21/67326 |
| | | | 118/500 |
| 6,871,741 B2 * | 3/2005 | Bhatt | G03F 7/70691 |
| | | | 206/454 |
| 6,874,638 B2 | 4/2005 | Iijima et al. | |
| 6,900,878 B2 | 5/2005 | Okubo et al. | |
| 7,033,168 B1 | 4/2006 | Gupta et al. | |
| 7,165,303 B2 | 1/2007 | Pfeiffer et al. | |
| 7,316,325 B2 | 1/2008 | Burns et al. | |
| 7,748,532 B2 | 7/2010 | Buitron et al. | |
| 8,033,401 B2 | 10/2011 | Lee et al. | |
| 8,727,125 B2 | 5/2014 | Tieben et al. | |
| 2001/0042697 A1 * | 11/2001 | Yajima | H01L 21/67383 |
| | | | 206/454 |
| 2002/0005369 A1 * | 1/2002 | Nyseth | H01L 21/67373 |
| | | | 206/711 |
| 2003/0010672 A1 * | 1/2003 | Simpson | H01L 21/67326 |
| | | | 206/711 |
| 2003/0024887 A1 * | 2/2003 | Dunford | G11B 33/0444 |
| | | | 211/41.18 |
| 2003/0038056 A1 * | 2/2003 | Nigg | H01L 21/67386 |
| | | | 206/711 |
| 2003/0085186 A1 * | 5/2003 | Fujioka | H01L 21/67086 |
| | | | 211/41.18 |
| 2003/0106865 A1 * | 6/2003 | Kaminski | A47B 88/08 |
| | | | 211/26 |
| 2003/0121870 A1 * | 7/2003 | Beckhart | H01L 21/6732 |
| | | | 211/41.18 |
| 2004/0022607 A1 * | 2/2004 | Lim | H01L 21/67313 |
| | | | 414/222.01 |
| 2004/0134828 A1 * | 7/2004 | Conarro | H01L 21/67386 |
| | | | 206/710 |
| 2004/0188320 A1 * | 9/2004 | Wiseman | H01L 21/6732 |
| | | | 206/710 |
| 2005/0006325 A1 * | 1/2005 | Hua | H01L 21/6732 |
| | | | 211/41.18 |
| 2005/0109665 A1 | 5/2005 | Duban-Hu et al. | |
| 2005/0263462 A1 | 12/2005 | Johnson et al. | |
| 2006/0021896 A1 * | 2/2006 | Cleathero | G11B 33/0472 |
| | | | 206/454 |
| 2007/0125726 A1 | 6/2007 | Seo | |
| 2008/0237157 A1 | 10/2008 | Chin et al. | |
| 2011/0250039 A1 | 10/2011 | Petzold et al. | |
| 2012/0187265 A1 * | 7/2012 | Bakerman | A61H 3/0244 |
| | | | 248/220.22 |

* cited by examiner

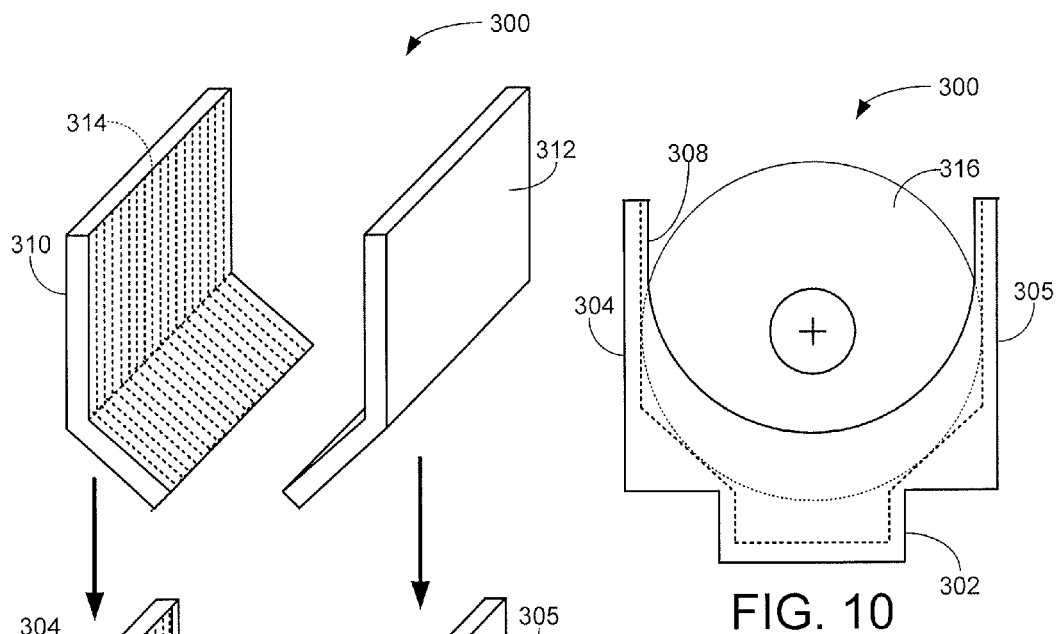
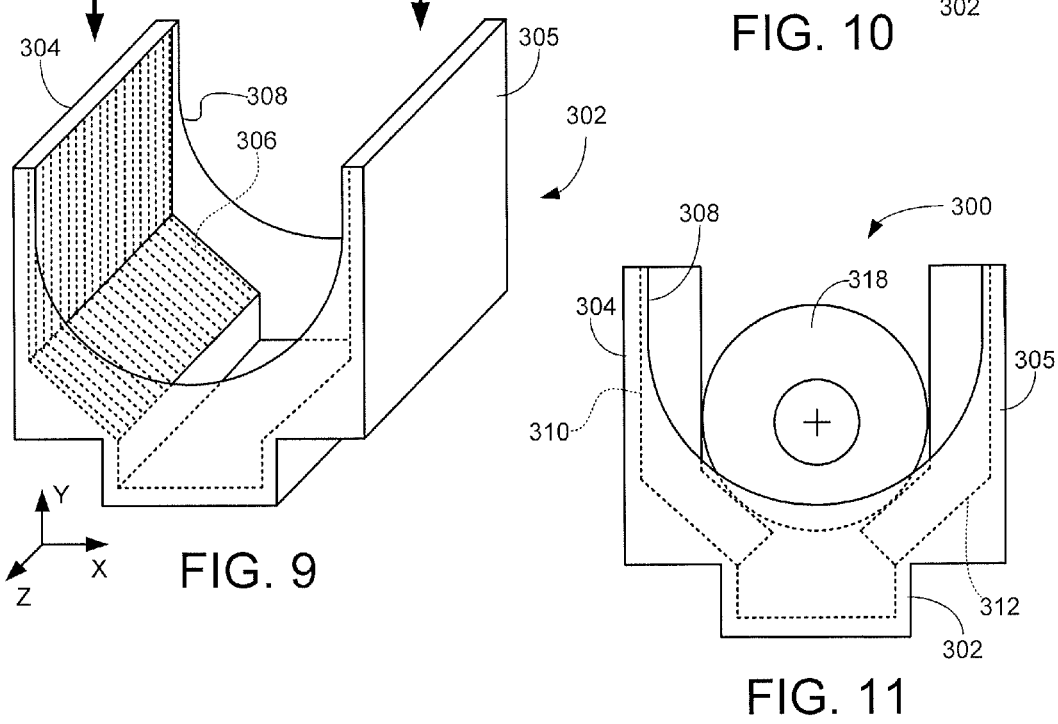
FIG. 9
FIG. 10
FIG. 11

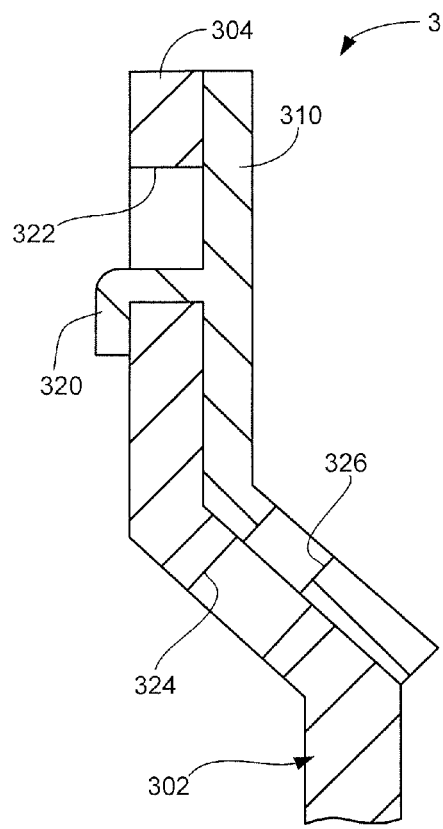
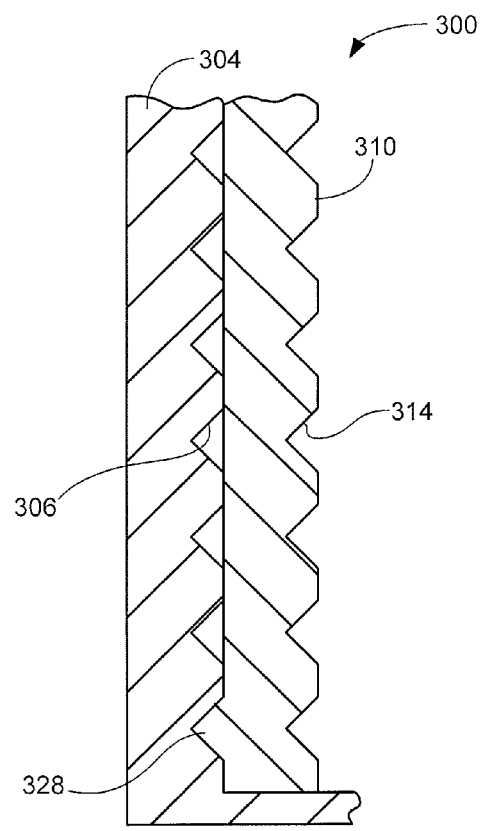
FIG. 12  FIG. 13
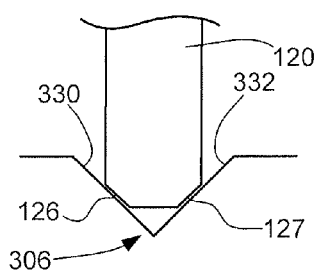
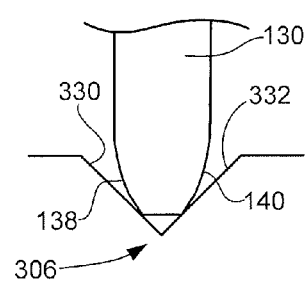
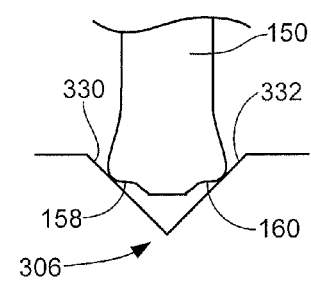
FIG. 14A  FIG. 14B  FIG. 14C

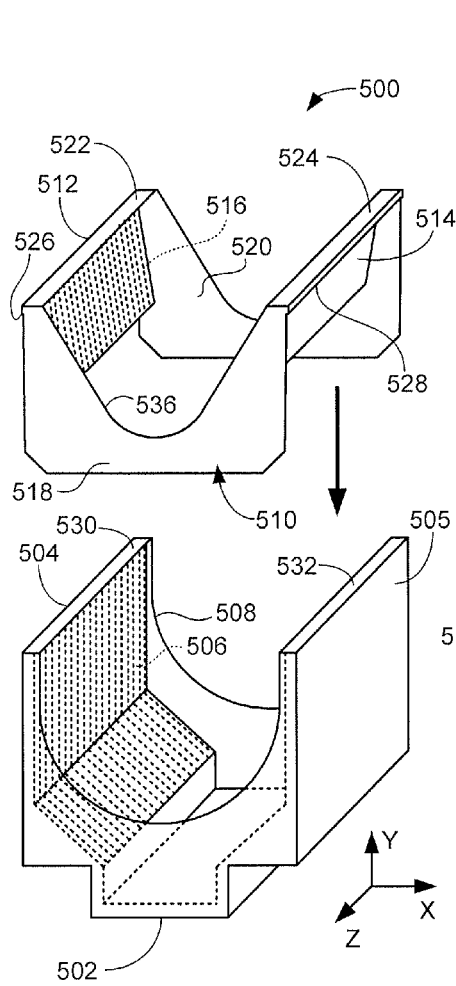
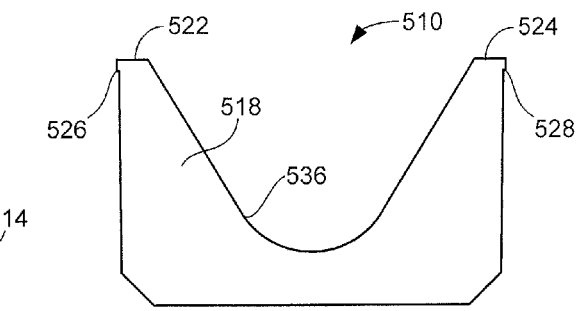
FIG. 20
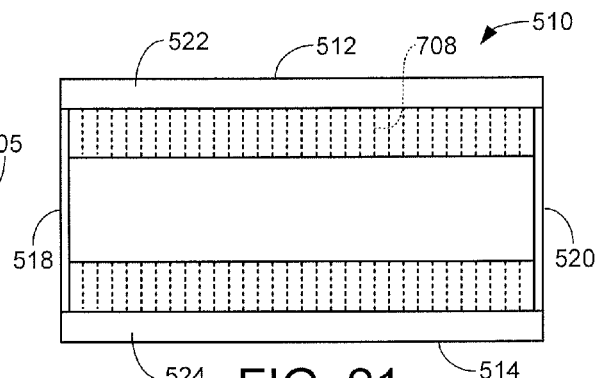
FIG. 21
FIG. 19
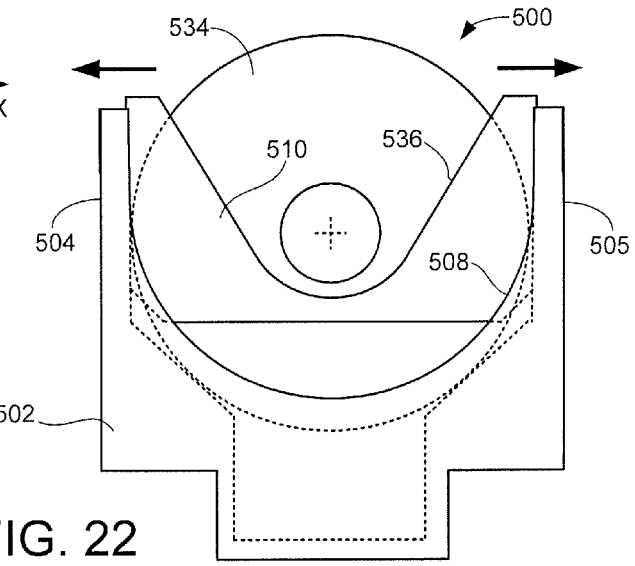
FIG. 22

CASSETTE CONFIGURATIONS TO SUPPORT PLATTERS HAVING DIFFERENT DIAMETERS

RELATED APPLICATIONS

The present application is a divisional of co-pending U.S. patent application Ser. No. 14/267,673 filed May 1, 2014, which issues as U.S. Pat. No. 9,117,863 on Aug. 25, 2015 which makes a claim of domestic priority under 35 U.S.C. §119(e) to U.S. Provisional Patent Application No. 61/824,263 filed May 16, 2013, the contents of which are hereby incorporated by reference.

SUMMARY

Various embodiments of the present disclosure are generally directed to a material handling apparatus adapted to support a plurality of disc-shaped platters, such as but not limited to a cassette assembly adapted to support data recording media or substrates during manufacturing.

In some embodiments, a cassette assembly includes a base cassette with a base and opposing first and second sidewalls having a first plurality of spaced-apart grooves configured to support an outermost perimeter of each of a first plurality of disc-shaped platters having a first diameter of nominally 95 millimeters, mm. Opposing first and second inserts are configured to contactingly engage the respective first and second sidewalls of the base cassette and have a plurality of spaced apart grooves to contactingly support an outermost perimeter of each of a second plurality of disc-shaped platters having a smaller, second diameter.

In further embodiments, a cassette assembly includes a base cassette and opposing first and second inserts. The base cassette has a base and opposing first and second sidewalls, the first and second sidewalls having a first plurality of spaced-apart grooves configured to support an outermost perimeter of each of a first plurality of disc-shaped data recording platters having a first diameter sized for use in a hard disc drive (HDD) having a 3½ inch form factor. The opposing first and second inserts are configured to contactingly engage the respective first and second sidewalls of the base cassette to provide a second plurality of spaced-apart grooves configured to contactingly support an outermost perimeter of each of a second plurality of disc-shaped data recording platters having a smaller, second diameter less than the first diameter sized for use in an HDD having a 2½ inch form factor.

In still further embodiments, an insert is provided for use with a base cassette. The base cassette has a base and opposing sidewalls configured to support an outermost perimeter of each of a first plurality of disc-shaped platters having a first diameter. The insert has an insert sidewall configured to contactingly engage at least a selected one of the opposing sidewalls of the base cassette, the insert sidewall comprising a plurality of spaced apart grooves to contactingly support an outermost perimeter of each of a second plurality of disc-shaped platters having a different, second diameter.

BRIEF DESCRIPTION OF DRAWINGS

FIG. 9 shows a cassette assembly constructed and operated in accordance with some embodiments.

FIG. 10 shows use of the cassette assembly of FIG. 9 to support a set of platters having a first outermost diameter.

FIG. 11 shows use of the cassette assembly of FIG. 9 to support a different set of platters having a second outermost diameter.

FIG. 12 shows portions of the cassette assembly of FIG. 9 to illustrate a first latching mechanism between the inserts and the base cassette.

FIG. 13 shows portions of the cassette assembly of FIG. 9 to illustrate a second latching mechanism between the inserts and the base cassette.

FIGS. 14A-14C illustrate grooves of the cassette assembly of FIG. 9 in conjunction with the respective substrate of FIGS. 3-5.

FIG. 19 shows another cassette assembly constructed and operated in accordance with some embodiments.

FIG. 20 is an end view of the insert of FIG. 19.

FIG. 21 is a top plan view of the insert of FIG. 20.

FIG. 22 shows use of the cassette assembly of FIG. 19 to support a set of platters having a selected outermost diameter.

DETAILED DESCRIPTION

Figure 1:
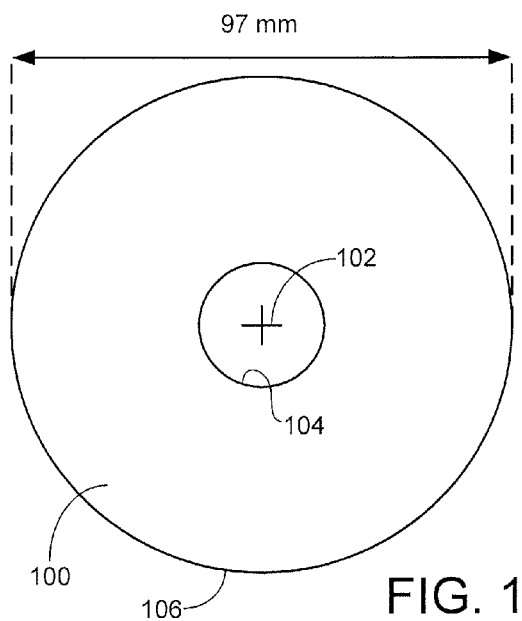
FIG. 1 shows an exemplary substrate for use in a 3½ inch form factor hard disc drive (HDD) in accordance with some embodiments.

The present disclosure is generally directed to cassette assemblies adapted to support disc-shaped platters, such as enlarged substrate and magnetic recording media formed therefrom.

Magnetic recording media are often provided in the form of magnetic recording discs which are incorporated into a hard disc drive (HDD) data storage device. The discs are rotated at a selected rotational velocity and accessed by a moveable read/write transducing head ("transducer") which records and reads data in the form of magnetic domains.

The progression in the HDD industry from 14 inch, 11 inch, 8 inch, 5½ inch, 3½ inch, 2½ inch to 1.8 inch and smaller storage device form factors is well documented. The progression to successively smaller form factor sizes was initiated by the floppy disk market, and followed by HDD manufacturers which produced HDDs of corresponding size. This was in part due to the standardization of mounting sizes of computer bays that could be used to secure the respective floppy disk drives and hard disc drives.

Each smaller form factor was (and remains) generally half as wide and half as long as the immediately larger form factor. This essentially allows two smaller devices to fit in the space provided for one larger device. For example, a 3½ inch form factor HDD has length and width dimensions of nominally 146.1 millimeters, mm (5.75 inches, in) by 101 mm (4.00 in). A 2½ inch form factor HDD has length and width dimensions of nominally 101 mm (4.00 in) by 73 mm (2.88 in), and so on.

Some of the earliest versions of commercially successful hard disc drives were referred to as "Winchester" drives, based on the so-called 30/30 system configuration from International Business Machines (IBM). The smaller 8 inch and 5½ inch versions were also referred to as "Winchester" drives. Smaller form factor drives in what later became known as the 3½ inch form factor class were initially widely referred to as "Micro-Winchester" drives. The 2½ inch drives did not enjoy a common moniker but were sometimes referred to as either "Micro-Miniature-Winchester" or "Mini-Winchester" drives. The HDD industry quickly standardized on a media size of 95 mm (OD) discs for the 3½ inch form factor and 65 mm (OD) discs for the 2½ inch form factor.

A typical magnetic recording disc comprises a magnetic recording structure that is formed on an underlying substrate. The recording structure can take a variety of forms and may include seed layers, interlayers, a soft underlayer, one or more magnetic recording layers, a carbon overcoat (COC) layer, a lubricant layer, etc. The substrate can be formed from a suitable rigid, disc-shaped material such as glass, metal, etc.

For magnetic recording discs that are incorporated into 2½ inch form factor and 3½ inch form factor HDDs, the substrates normally include an inner sidewall at a radius of 12.5 mm, an outer sidewall at a radius of nominally 32.5 mm (for 65 mm discs) and 47.5 mm (for 95 mm discs), opposing top and bottom flat surfaces that extend substantially from the inner sidewall to the outer sidewall, and relatively small, inner and outer chamfered surfaces between the top and bottom flat surfaces and the respective inner and outer sidewalls. The chamfered surfaces extend at a suitable angle, such as 45 degrees, and provide gripping surfaces for use during manufacturing since it is generally undesirable to mechanically contact either the flat surfaces of the substrates or the flat surfaces of the completed magnetic recording media. Substrate thicknesses can vary but may be on the order of around 1 mm.

A polishing process is often applied to a substrate prior to the formation of the recording structure thereon. The polishing process is intended to achieve a specified flatness for the top and bottom flat surfaces of the substrate in terms of maximum axial deviation in localized changes in elevation of the substrate material.

One difficulty associated with the substrate polishing process relates to relief zones that tend to be formed adjacent the respective inner and outer ends of the flat surfaces. The sharp junctions between the flat surfaces and the respective inner and outer chamfered surfaces tend to be treated as high points by the polishing process, so that abrupt relief zones may be formed on the substrate adjacent the inner and outer sidewalls.

The relief zones can provide negative deviation or positive deviation from the elevation of the adjacent flat surface. Negative deviation relief zones are sometimes referred to as duboff (DO) zones, and positive deviation relief zones are sometimes referred to as ski jump (SJ) zones. The relief zones can extend a significant radial distance across the surfaces of the substrates, such as on the order of about 2 mm. The transition point between the nominally flat surface and the relief zone is sometimes referred to a radius of rolloff (ROR) point. Thus, a typical ROR point may at a radius of about 45.5 mm for a 95 mm substrate/disc (collectively "platter"), and a typical ROR point may be at a radius of about 30.5 mm for a 65 mm platter.

As a data transducer is moved outwardly over a relief zone that changes in elevation away from the flat recording area of a disc, such as by curving down in a DO zone or curving upwardly in an SJ zone, at some point the flight characteristics of the data transducer will become unstable and the transducer will experience a variety of undesired flight characteristics including increased fly height, oscillations and/or disc contact. In some cases it has been found that data transducers become unstable responsive to a positive or negative change in elevation over a range beginning as little as about 100-200 nm. As fly heights and transducing element sizes continue to decrease, it is expected that sensitivity to elevational changes in the disc topography will continue to increase, so that future heads will become unstable at even lower elevational ranges.

Carrier type devices are often used during manufacturing to safely store and transport substrates and magnetic recording media (discs). Such devices, sometimes referred to as cassettes, caddies, carriers, shippers, etc. (hereinafter generally "cassettes") may be configured as box-like structures with grooves to accommodate a plurality of axially aligned platters (substrates/discs). The structures are often open at the top and at both ends to allow automated equipment to individually select, remove and replace the various platters.

Production cassettes are open structures that are moved along a conveyor line or other automated path to advance the substrates and/or discs to different manufacturing stations, and may have openings in the sides for drainage resulting from washing and other manufacturing processes. Shipper cassettes ("shippers") are closed structures that are generally covered by a lid to allow transport of the platters to a different facility or otherwise along a transport path subject to vibration, contamination, etc. Many thousands of production cassettes and shipper cassettes may be utilized in a high volume manufacturing environment to handle the daily workload.

Standard sized platters, such as 95 mm and 65 mm outer diameter (OD) substrates and discs, can be easily accommodated by existing cassette configurations. However, there is not a ready source cassettes to accommodate other, non-standard sized substrate and disc (hereinafter "platter") sizes.

Accordingly, various embodiments of the present disclosure are generally directed to a variety of novel cassette configurations to accommodate larger than standard sized platters. Both production cassettes and shipper cassettes are disclosed. Each of the cassette configurations is adapted to securely support different OD sizes of platters, such as nominally 97 mm platters and nominally 67 mm platters.

In some cases, a cassette is provided with dimensions adapted to support each of a plurality of platters having a first diameter. An insert contactingly engages the cassette to enable the cassette to support each of a plurality of platters having a different, second diameter. In some cases, the first diameter is larger than the second diameter. In other cases, the first diameter is smaller than the second diameter. In further cases, the difference between the first and second diameters is nominally at least 2 millimeters (mm).

The insert may form a portion of a pair of opposing inserts that engage opposing sidewalls of the cassette. The insert may be characterized as an adapter mechanism that "stretches" an existing cassette to enable it to accommodate a slightly larger platter. Additionally or alternatively, the insert may be adapted to engage the base of the cassette to support a lowermost perimeter of the platters having the second diameter.

Without limitation, embodiments of the various cassette configurations are adapted to support enlarged sized substrates and discs for use in standard HDD form factor sizes. For purposes of illustration and not by way of limitation, substrates having an outer diameter of nominally 97 mm, rather than the standard 95 mm, are used to form corresponding media for a 3½ inch form factor HDD. Similarly, substrates having an outer diameter of nominally 67 mm, rather than the standard 65 mm, are used to form corresponding media for a 2½ inch form factor HDD. Other enhanced sizes can be used. In some cases, substrates of nominally 98 mm and 68 mm are used. In other cases, substrates of nominally 99 and 69 mm are used. In still other cases, substrates of from about 96.9 mm up to about 100.4 mm can be used for 3½ inch form factor drives, and substrates of from about 66.9 mm up to about 71.8 mm can be used for 2½ inch form factor drives. In still further cases, substrates greater than 100.4 mm are used in 3½ in form factor drives and substrates greater than 71.8 mm are used in 2½ inch form factor drives. Other ranges can be used.

The use of 97 mm and 67 mm substrates, respectively, nominally provides an additional 2 mm of radial distance outwardly for each substrate as compared to the standard substrate sizes of 95 mm and 65 mm. Such sizes of substrates, and finished recording media, can be readily accommodated in the associated form factor sizes; more specifically, a 97 mm disc has been found to be readily be accommodated into a 3½ inch form factor HDD with nominal dimensions of about 146.1 mm by about 101 mm, and a 67 mm disc has been found to be readily be accommodated into a 2½ inch form factor HDD with nominal dimensions of about 101 mm by about 73 mm.

These and other features of various embodiments of the present disclosure can be understood beginning with a review of FIG. 1 which provides a top plan view of an example substrate 100. The substrate 100 is formed of glass, and may be subjected to chemical processing as is known in the art. Other material configurations and processing can be used, such as a metal substrate, a ceramic substrate, a plastic substrate, a semiconductor substrate, etc. The substrate 100 has an overall diameter D, which in this case is nominally 97 mm, and without limitation is designed for recording media to be used in a hard disc drive (HDD) of 3½ inch form factor. Other sizes can be used, including but not limited to 98 mm, 99 mm, 100 mm, 100.8 mm, etc.

The substrate 100 has a center point 102 about which the substrate (and finished medium) is configured to rotate. An inner sidewall 104 forms a central aperture in the substrate 100. The sidewall is provided at a selected radius such as nominally 12.5 mm from the center point 102. The substrate has an outer sidewall 106, which constitutes a substantially vertically extending edge, at a radius of nominally 48.5 mm from the center point 102. It will be appreciated that other diameters for the substrate 100 can be used, including without limitation an outer diameter of nominally 96.9 mm to nominally 100.8 mm.

Figure 2:
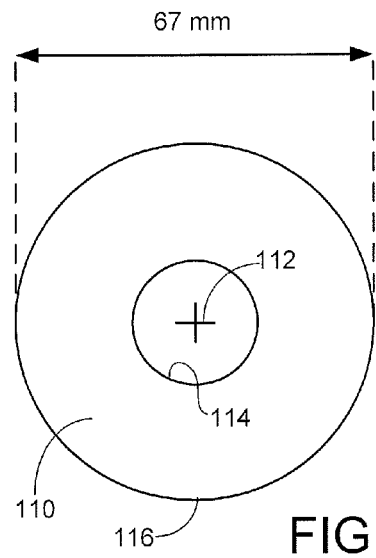
FIG. 2 shows an exemplary substrate for use in a 2½ inch form factor HDD in accordance with some embodiments.

FIG. 2 shows a top plan for a substrate 110 that is also formed of glass (or other suitable material) and subjected to chemical processing as known in the art. The substrate 110 has an overall diameter D which in this case is nominally 67 mm. Without limitation, the substrate is designed for recording media to be used in an HDD with a 2½ inch form factor. Other material configurations and processing can be used. As with the substrate 100, the substrate 110 is configured for rotation about a center point 112 and has an interior sidewall 114 at radius 12.5 mm and an outer sidewall 116 at nominally 34 mm. As before, other outer diameters for the substrate 110 can be used including, without limitation, diameters of nominally 66.9 mm to nominally 72.8 mm.

While FIGS. 1-2 show non-standard sized substrates that are slightly larger than the 95 mm and 65 mm classes of substrates, other non-standard sizes of substrates can be utilized, including but not limited to substrates having an outermost diameter of nominally 44 mm, 45 mm, 46 mm, 84 mm, 85 mm, 86 mm, etc.

Figure 3:
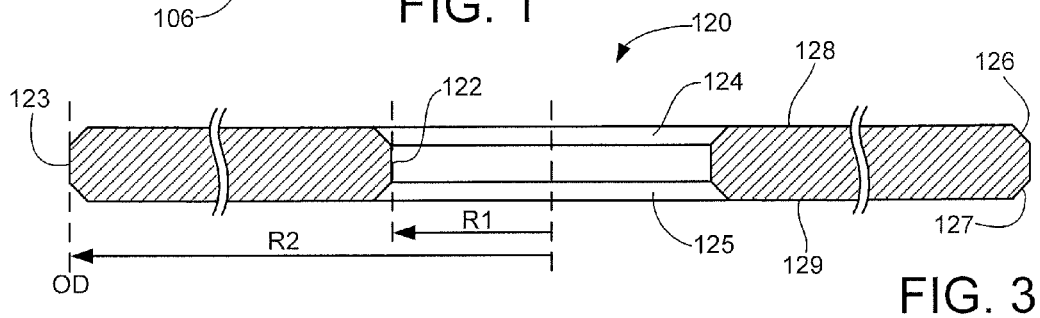
FIG. 3 is a cross-sectional, elevational view of another substrate that may correspond to the substrates of FIGS. 1-2.

FIG. 3 shows another substrate 120 in accordance with some embodiments. The substrate 120 is shown in a cross-sectional elevational mode. Aspect ratios and other relative dimensional aspects may vary. The substrate 120 has an inner sidewall 122 at radius R1 and an outer sidewall 123 at radius R2. These values R1 and R2 can correspond to the radii set forth in FIGS. 1-2 above for the 97 mm substrate 100 and the 67 mm substrate 110, or can correspond to other values. Inner and outer chamfered surfaces are respectively depicted at 124, 125 and 126,127. The chamfered surfaces extend at an angle of 45 degrees although other angles can be used as desired, such as but not limited to 25 degrees. Opposing top and bottom flat surfaces are denoted at 128 and 129.

Figures 4, 5:
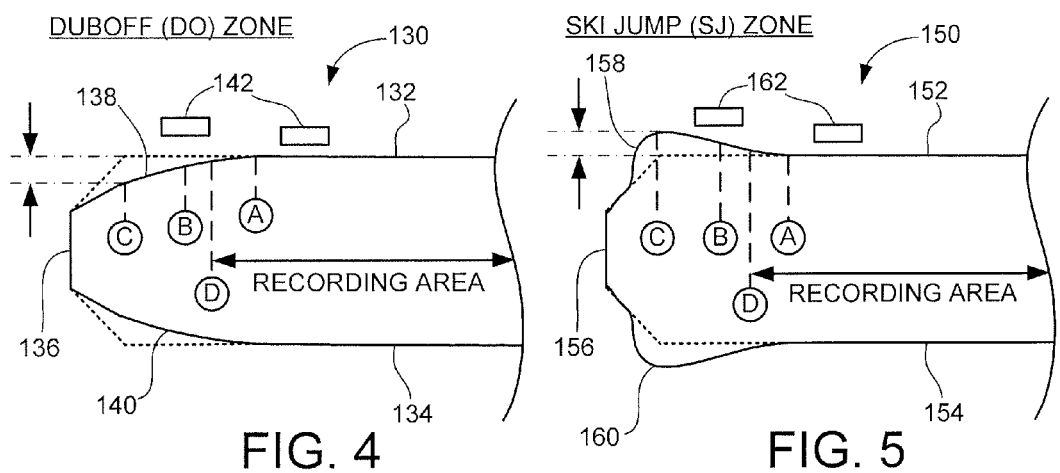
FIG. 4 is an end view of another enlarged substrate with a duboff (DO) zone.
FIG. 5 is an end view of another enlarged substrate with a ski jump (SJ) zone.

The substrates 100, 110 and 120 are in an unpolished state and can be manufactured using known processing techniques apart from the specialized dimensions and other information disclosed herein. FIG. 4 depicts a polished substrate 130 corresponding to the substrates 100, 110 and 120 after the application of a polishing process. The polished substrate 130 has upper and lower flat surfaces 132, 134, outer sidewall 136 (OD surface), and upper and lower relief zones 138, 140. The relief zones 138, 140 are characterized as duboff (DO) zones and provide a radiused decrease in elevational topography of the substrate with respect to the respective flat surfaces 132, 134. It will be appreciated that the substrate 130 is merely illustrative and different relative dimensions of the various depicted aspects can be provided. The pre-polishing profile is depicted in broken line fashion.

A head is denoted at 142 and may represent a data transducing head (transducer) used once a magnetic recording structure has been formed on the substrate 130, or may represent a special test head (e.g., a glide head) used during evaluation of the polished substrate prior to magnetic structure fabrication.

It can be seen that the polishing process generally rounds off the sharp junctions between the flat surfaces and the outer chamfered surfaces, and erodes the substrate toward the substrate center point. Reference point A generally depicts an outer extent of the upper flat surface 132 and thus denotes the radial transition point between the flat surface 132 and the DO relief zone 138. Point A is sometimes referred to as a radius of rolloff, or ROR point. Reference point B represents a point at which the head 142 experiences unstable flight characteristics due to the negative deviation distance between the flat surface 132 and the relief zone 138 at this point. As noted above, this can vary based on a variety of factors but in some cases may be on the order of about 100-200 nm.

Reference point C identifies the maximum deviation distance from the (original) flat surface elevation of the substrate, and thus indicates the maximum change in thickness resulting from the polishing process. Reference point D identifies the outermost extent of the recording area on the finished magnetic recording disc.

It will be appreciated that the various layers of the recording structure may be applied to the entirety of the outer surfaces of the substrate 130, but the HDD will be configured such that the outermost active data track is at the radius corresponding to point D. A ramp load structure (not separately shown) may be placed just outside of point D to facilitate unloading and loading operations of the head 142.

Point D may be at the same location as point B, or may be radially inward of point B as shown. The relative locations and spacings of points A-D can vary depending on a variety of factors including the polishing process, composition of the substrate, chemical processing applied to the substrate, test data, product specifications, etc.

FIG. 5 represents another example polished substrate 150, which also may arise from the application of a polishing process to one of the foregoing unpolished substrates 100, 110, 120. The polished substrate 150 exhibits a ski jump (SJ) relief zone configuration, characterized as a positive elevation in the relief zone adjacent the OD of the substrate. The ski jump profile is generated by displacement of the substrate material during the polishing process. In some cases, both DO and SJ characteristics may arise on the same substrate at different angular locations around the perimeter of the substrate.

The polished substrate 150 includes opposing upper and lower flat surfaces 152, 154; outer sidewall (OD surface) 156; and upper and lower ski jump (SJ) relief zones 158, 160. As before, point A denotes an outer radial extent of the flat surfaces 152, 154, and therefore connotates a radius of rolloff (ROR) point. Point B denotes the maximum change in elevation over the relief zones 158, 160 at which a head 162 becomes unstable. Point C is the location of the maximum elevation of the relief zones 158, 160, and point D represents the outermost radial extent of the recording area on the finished recording disc. The various distances from the OD surface 156 to points A-D may correspond to the values provided above in FIG. 4, or may be different.

Figure 6:
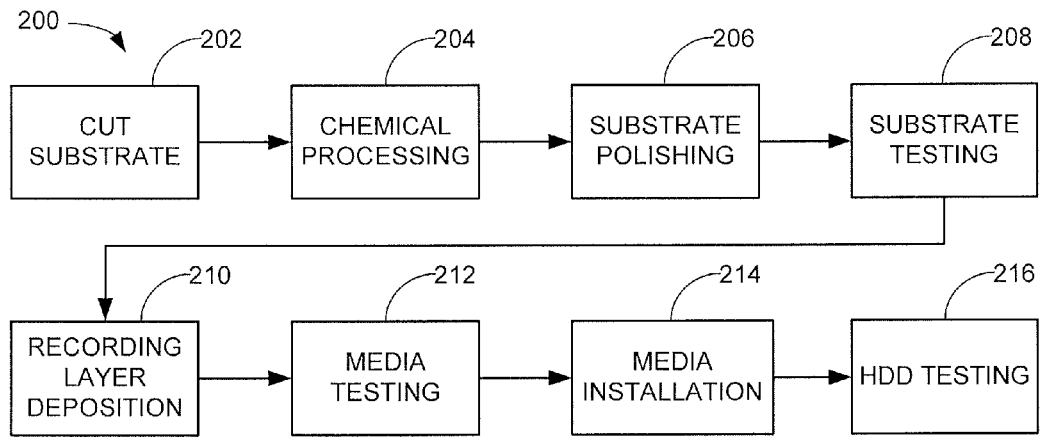
FIG. 6 is a functional block representation of a manufacturing processing applied to the substrates of FIGS. 1-5 in accordance with some embodiments.

FIG. 6 is a generalized flow diagram to illustrate aspects of a manufacturing process 200 that may be used to manufacture hard disc drives (HDDs) that incorporate substrates as set forth by FIGS. 1-5. The various operational blocks are illustrative only and can be modified, carried out in a different order or omitted. Additional operations can be incorporated into the flow as desired. The various operational blocks may be carried out at a common facility, or products may be fabricated and transported to different, geographically distributed facilities during the course of the manufacturing process.

Substrates are initially cut from sheet glass or other substrate material at block 202. The substrates will generally have the shape shown in FIG. 3 and may have a desired nominal outer diameter (OD) dimension such as illustrated in FIG. 1 or 2.

Chemical processing may be applied to the cut substrates at block 204. Such processing may change the chemical arrangement and/or structure of the substrates to better undergo downstream processing.

The substrates are next polished at block 206. This can involve the concurrent polishing of a plurality of substrates in rotatable carriers between opposing upper and lower pads as known in the art. A polishing slurry may be applied to aid the polishing process. The resulting polished substrates may have OD relief zones such as depicted in FIG. 4 and/or FIG. 5.

As desired, substrate testing is carried out at block 208. In some cases, a specially configured glide head may be hydrodynamically supported adjacent a rotating substrate to evaluate various characteristics of the substrate, including flatness and radial extent of the ROR point. As noted above, one feature of using larger than standard sized substrates is the potential improvement in manufacturing yields at this point in the process, since an enlarged flat surface area of a substrate as disclosed herein may allow a greater percentage of the substrates to provide acceptable flight characteristics out to a specified radius, and therefore, be accepted for subsequent processing.

Recording layer deposition operations are denoted at block 210. As will be appreciated by those skilled in the art, a number of layers of magnetic and non-magnetic material can be successively deposited on a base substrate including, but not limited to, seed layers, soft magnetic underlayers (SULs), interlayers (ILs), soft magnetic recording layers, hard magnetic recording layers, granular recording layers, continuous granular coupled (GCC) layers, protective overcoat layers, lubricant layers, etc. A variety of deposition processing steps can be applied including sputtering, physical vapor deposition (PVD), chemical vapor deposition (CVD), etc. The deposited layers form a recording structure that is supported by the substrate. In many cases, the entirety of the substrate, including top and bottom sides, relief zones and innermost and outermost edges are coated with some or all of these layers. The finished medium may be a perpendicular recording medium, a longitudinal recording medium, a bit patterned medium, a printed medium, a heat assisted magnetic recording (HAMR) medium, etc.

The completed recording media are next tested at step 212. This may include glide head testing to ensure flatness and areal extent as well as tests of the magnetic characteristics of the recording structure. It is contemplated that the use of enlarged substrates as disclosed herein will tend to provide improved manufacturing yields at this point in the process.

The finished media are next installed into hard disc drives (HDDs) at step 214. This may be carried out using an automated manufacturing process. The media are axially stacked onto a rotatable spindle motor hub and installed on an HDD base deck, and an actuator (head/stack assembly) is merged with the media stack to provide a head (data read/write transducer) adjacent each recording surface of the media. Other HDD components are also installed at this time to provide a finished, operational HDD.

HDD level testing is next performed at block 216. This level of testing may include the reading and writing of test data to the media. As before, it is contemplated that the enlarged substrates as disclosed herein will provide improved manufacturing yields at this point in the process.

Figure 7:
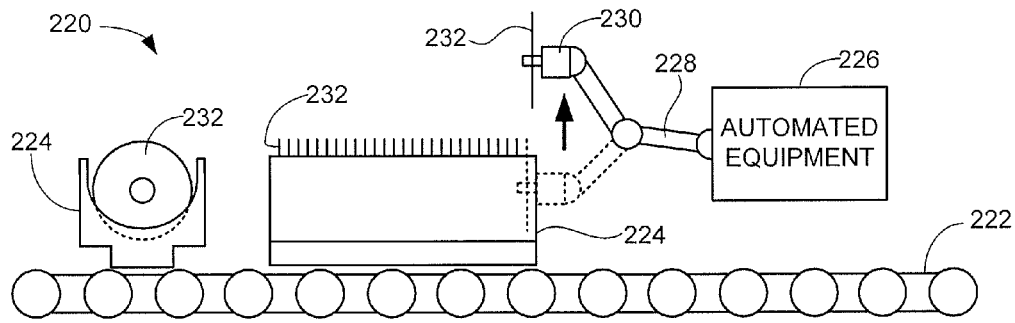
FIG. 7 schematically depicts a conveyor and automated equipment useful in the manufacturing processing of FIG. 6.

During the various foregoing manufacturing process operations, groups of substrates and media (hereafter collectively "platters") may be temporarily secured within containers to allow the physical manipulation and transport from one operation to the next. FIG. 7 depicts a portion of an automated processing environment 220 that may be incorporated as part of one or more of the operational blocks of FIG. 6 (or between the respective operations). The environment 220 includes a conveyor line 222, various cassettes 224 that may be advanced along the conveyor line 222, and automated equipment 226 having a robotic arm 228 with an end effector 230 sized to individually select, remove and replace platters 232 for various processing operations.

The two cassettes 224 depicted in FIG. 7 are shown at right angles to one another to illustrate various aspects of the cassettes. Generally, the cassettes 224 are fully open across the top and are partially open at opposing ends to allow clearance access by the end effector 230 and other manufacturing equipment. The tops of the platters 232 may or may not project above the sidewalls of the cassettes, as desired.

Figure 8:
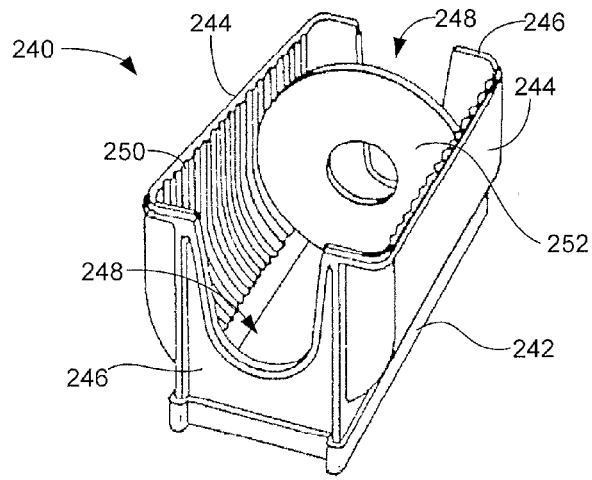
FIG. 8 depicts a base cassette configured in accordance with some embodiments.

FIG. 8 is an isometric depiction of one form of cassette 240 to be discussed in greater detail below. The cassette 240 includes a base 242, opposing sidewalls 244, and partially open, opposing ends 246. A generally u-shaped access aperture 248 is provided in each of the opposing ends 246 for clearance by the end effector 230 (see FIG. 7) and other equipment. Other shapes can be used so that a u-shaped opening is merely exemplary and not limiting.

The cassette 240 includes interior, parallel v-shaped grooves 250 adapted to accommodate a first size of platter 252. As discussed below, the cassette 240 is further adapted to receive one or more sets of inserts to further enable the cassette 240 to accommodate a different, second size of platter.

The cassette 240 can be adapted for use as processing cassettes or shipper cassettes. In the case of processing cassettes, other features can be provided such as drainage openings in the sides and bottom surfaces. In the case of shipper cassettes, lids (not separately shown) can be added to enclose the cassettes and provide further support for the individual platters. Other features can be incorporated into the respective processing and shipper cassettes as required by a given application.

Various alternative embodiments that utilize base cassettes such as 240 will now be discussed. A first cassette embodiment is set forth by FIGS. 9-14C, which generally illustrate a cassette assembly 300 that uses inserts with an existing cassette to accommodate different OD sized platters.

As depicted in FIG. 9, an existing cassette 302 generally corresponding to the base cassette 240 includes opposing first and second sidewalls 304, 305 each having a set of grooves 306 to contactingly support a selected OD size platter having a first overall diameter. The sidewalls 304, 305 may include openings 308 along each end to facilitate manipulation of the platters.

A pair of inserts 310, 312, are adapted to be attached to the respective sidewalls 304, 305. The inserts 310, 312 are generally L-shaped sidewall portions although other configurations can be used. Each of the inserts 310, 312 includes a second set of grooves 314. When installed, the inserts 310, 312 are adapted to support a second, smaller OD size platter. The inserts 310, 312 can have any suitable dimensions, sizes and/or thicknesses.

For reference, respective x, y and z axes are depicted in FIG. 9. The x-axis generally represents the directional span from one sidewall (e.g., 304) to the next (e.g., 305). The y-axis generally represents the axial direction along which the inserts 310, 312 are placed into the base cassette 302 as well as the axial direction along which platters are loaded into the cassette assembly 300. The z-axis generally represents the axial length of the base cassette 302 (and correspondingly, the axial length of each insert 310, 312). Each platter is placed at a different z location within the cassette assembly 300 and extends along an xy plane.

FIG. 10 shows the base cassette 302 of FIG. 9 with a first set of platters 316 installed therein. The first set of platters has a first, relatively larger diameter. The first set of platters 316 is supported by the opposing grooves 306 in the base cassette. FIG. 11 shows the base cassette 302 of FIG. 9 with a second set of platters 318 installed therein. The second set of platters 318 has a smaller diameter than the first platters 316, and is supported by the opposing grooves 314 in the respective inserts 310, 312.

A second set of inserts (not shown) with different dimensions can be installed in lieu of the inserts 310, 312 to accommodate a third set of platters with a different overall diameter as compared to the first and second sets. Although not limiting, in one embodiment the first set of platters 316 has an outermost diameter of nominally 95 mm, and the second set of platters 318 has an outermost diameter of nominally 67 mm.

The inserts 310, 312 can be provided with latching (securement) mechanisms to facilitate attachment to the base cassette 302. FIG. 12 shows a first latching mechanism of the insert 310 comprising a pin member 320 that extends through an aperture 322 in the sidewall 304. The aperture 322 may be a drainage aperture to allow cleaning fluids (e.g., water) to drain from the base cassette 302. Further apertures can be provided in the base cassette and insert as desired, such as represented at 324 and 326, respectively.

FIG. 13 is a top plan view of another arrangement of the base cassette 302 and the insert 310 in accordance with some embodiments. The grooves in the sidewall 304 are depicted at 306, and are numbered from 0 to N (where N is a plural number, such as N=26). The insert 310 includes a projection 328 which contactingly engages the first groove (e.g., groove 0) as shown. A second projection (not shown) can similarly contactingly engage the last groove (e.g., groove 26). The projection 328 can take a general v-shape as shown, or some other shape that will contactingly engage the grooves 306 and tend to cause the insert 310 to remain affixed to the sidewall 304.

Other securement mechanisms can be employed to secure the inserts 310, 312 to the base cassette, such as but not limited to adhesives, fasteners, clamps, straps, rivets, welds, tape, pins, etc., so the mechanisms shown in FIGS. 12-13 are merely exemplary and are not limiting. It will be appreciated that the securement mechanisms are replicated in both inserts 310, 312. The coupling of the inserts can form a permanent attachment arrangement or a removable attachment arrangement. If a removable attachment arrangement is used, the inserts can be removed and the base cassette returned to service to support the first sized platters.

FIGS. 14A-14C depict typical contacting engagement between different forms of substrates and media and the respective grooves 306 in the base cassette 302. Corresponding engagement is provided by the secondary grooves 314 provided in the inserts 310, 312. While v-shaped grooves are depicted, such are merely exemplary and not necessarily required.

FIG. 14A shows the unpolished substrate 120 from FIG. 2 with the chamfered edges 126, 127 contactingly engaging angled surfaces 330, 332 in the groove 306. While it is contemplated that both the chamfers and the groove surfaces will be at the same nominal angle (such as 45 degrees), such is not necessarily required.

FIG. 14B shows the polished substrate 130 from FIG. 4 in a selected groove 306. It will be appreciated that a finished disc formed from the substrate will generally have the same OD contour and will engage the groove 306 in substantially the same way. FIG. 14C shows the polished substrate 150 from FIG. 5 in a selected groove. As before, a finished disc formed from the substrate will have substantially the same OD contour and will engage the groove 306 in substantially the same way.

From FIGS. 14A-14C it can be seen that the base cassette 302 and the inserts 310, 312 can be sized to accommodate unpolished substrates, polished substrates and finished media of various sizes. The grooves 306, 314 in the base cassette 302 and the inserts 310, 312 generally contactingly engage the end surfaces of the platters and do not contact the planar polished/recording surfaces of the platters. The inserts 310, 312 allow cassettes sized for standard platter sizes to be efficiently and easily adapted to support non-standard platter sizes.

Figure 15:
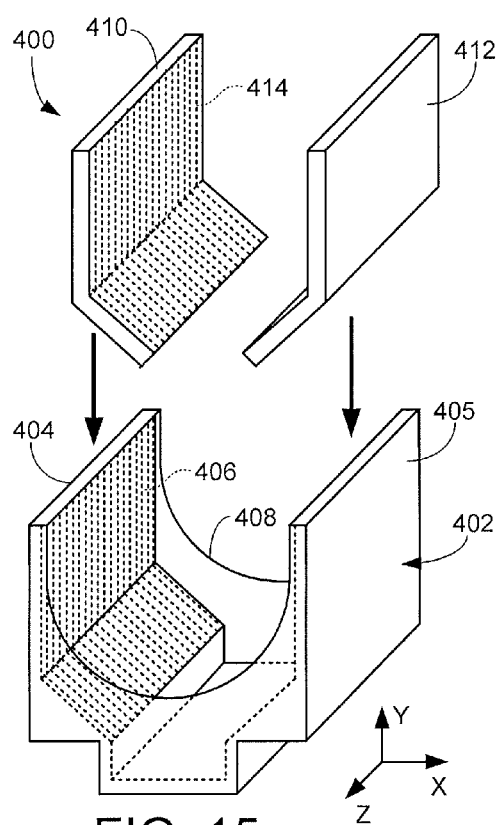
FIG. 15 shows another cassette assembly constructed and operated in accordance with some embodiments.

FIGS. 15-18 illustrate a related embodiment for a cassette assembly 400 configured as a shipper cassette to enclose platters for shipment. As shown in FIG. 15, the cassette assembly 400 generally includes a base cassette 402 with opposing sidewalls 404, 405, grooves 406 formed in the sidewalls 404, 405, and openings 408.

First and second inserts 410, 412 have corresponding grooves 414. As before, the first and second inserts 410, 412 are adapted to contactingly engage the respective sidewalls 404, 405 of the base cassette 402. Securement mechanisms such as depicted in FIGS. 12-13 can be used to secure the inserts 410, 412 to the sidewalls 404, 405.

Figure 16:
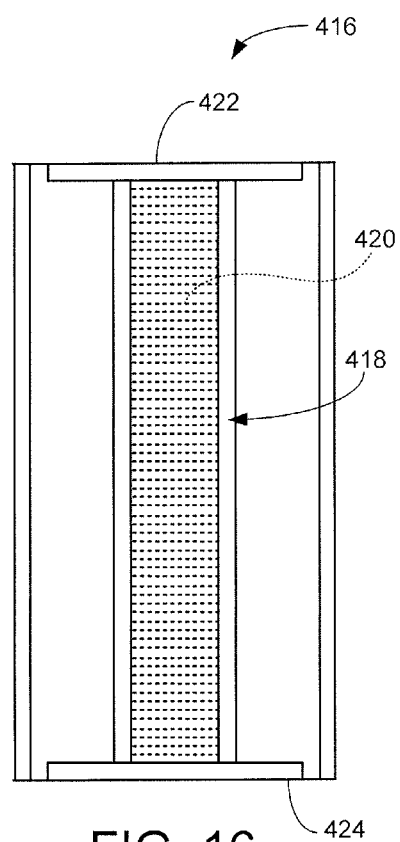
FIG. 16 depicts a lid (top cover) of the cassette assembly of FIG. 15.

A lid 416 for the cassette assembly 400 is shown in FIG. 16. The view in FIG. 16 is a bottom facing plan view to illustrate a central raised projection member 418 that runs the length of the lid. Grooves 420 extend across the projection member 418 to contactingly engage the upper perimeters of the platters in a manner similar to FIGS. 14A-14C. The lid further includes opposing cover flanges 422, 424 that cover the openings 408.

Figure 17:
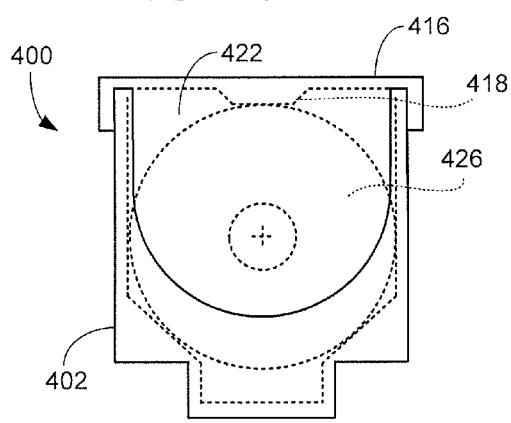
FIG. 17 shows use of the cassette assembly of FIG. 15 to support a set of platters having a first outermost diameter.
Figure 18:
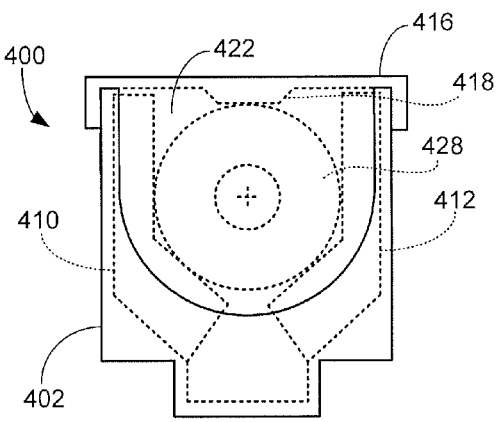
FIG. 18 shows use of the cassette assembly of FIG. 15 to support a different set of platters having a second outermost diameter.

FIG. 17 shows the base cassette 402 and lid 416 to support a first set of platters 426 having a first overall diameter. FIG. 18 additionally shows the inserts 410, 412 to support a second set of platters 428 having a smaller, second overall diameter. As before, the respective base cassette 402 and the inserts 410, 412 can have any suitable dimensions to accommodate respective sizes of platters. In one non-limiting example, the platters 426 have an outermost diameter of nominally 95 mm, and the platters 428 have an outermost diameter of 67 mm. Regardless of the respective sizes, it will be appreciated that the inserts 310, 312 and 410, 412 allow the base cassettes 302, 402 to support relatively smaller diameter platters.

FIGS. 19-22 illustrate another embodiment for a cassette assembly 500. The cassette assembly 500 includes a base cassette 502 with opposing sidewalls 504 and 505, grooves 506, and openings 508. A one-piece insert 510 includes opposing sidewalls 512, 514 with grooves 516 therein. End support members 518 and 520 interconnect the respective ends of the sidewalls 512, 514 to rigidly establish the separation distance therebetween. To this end, the one-piece insert 510 is similar to the inserts of the cassette assemblies 300 and 400 in that the respective sidewalls 512, 514 (also referred to herein as first and second inserts) of the one-piece insert 510 contactingly engage the corresponding sidewalls 504, 505 of the base cassette 502.

However, the insert 510 is characterized as an adapter which extends, or spreads, the sidewalls 504, 505 of the base cassette 502 upon installation. The sidewalls 512, 514 are provided with longitudinally extending top support members 522, 524 with respective shoulder surfaces 526, 528 that engage top surfaces 530, 532 of the sidewalls 504, 505 of the base cassette 502. In this way, the end support members 518, 520 wedge between the sidewalls 504, 505 to deform the sidewalls 504, 505 away from each other, enabling the cassette assembly 500 to accommodate a slightly larger sized platter 534 (see FIG. 22).

In other words, the sidewalls 504, 505 in the base cassette 502 are nominally separated by a first distance, and the insert 510 spreads the base cassette 302 so that the opposing first and second sidewalls of the base cassette are deflected by the adapted so to be separated by a larger, second distance. In one example, the base cassette 502 is adapted to support platters of nominally 95 mm in diameter, and the installation of the adapter 510 enables the base cassette 502 to support platters of nominally 97 mm in diameter. In another example, the base cassette 502 is adapted to support platters of nominally 65 mm in diameter, and the installation of the adapter 510 enables the base cassette 502 to support platters of nominally 67 mm in diameter. Other respective sizes of platters can be used.

It is contemplated that the adapter 510 can be configured to engage the first and last grooves 506 (e.g., grooves 0 and 26) of the cassette sidewalls 504, 505. Openings 536 can be provided in the end support members 518, 520 to allow access to the loaded platters.

Figures 23, 24A, 24B:
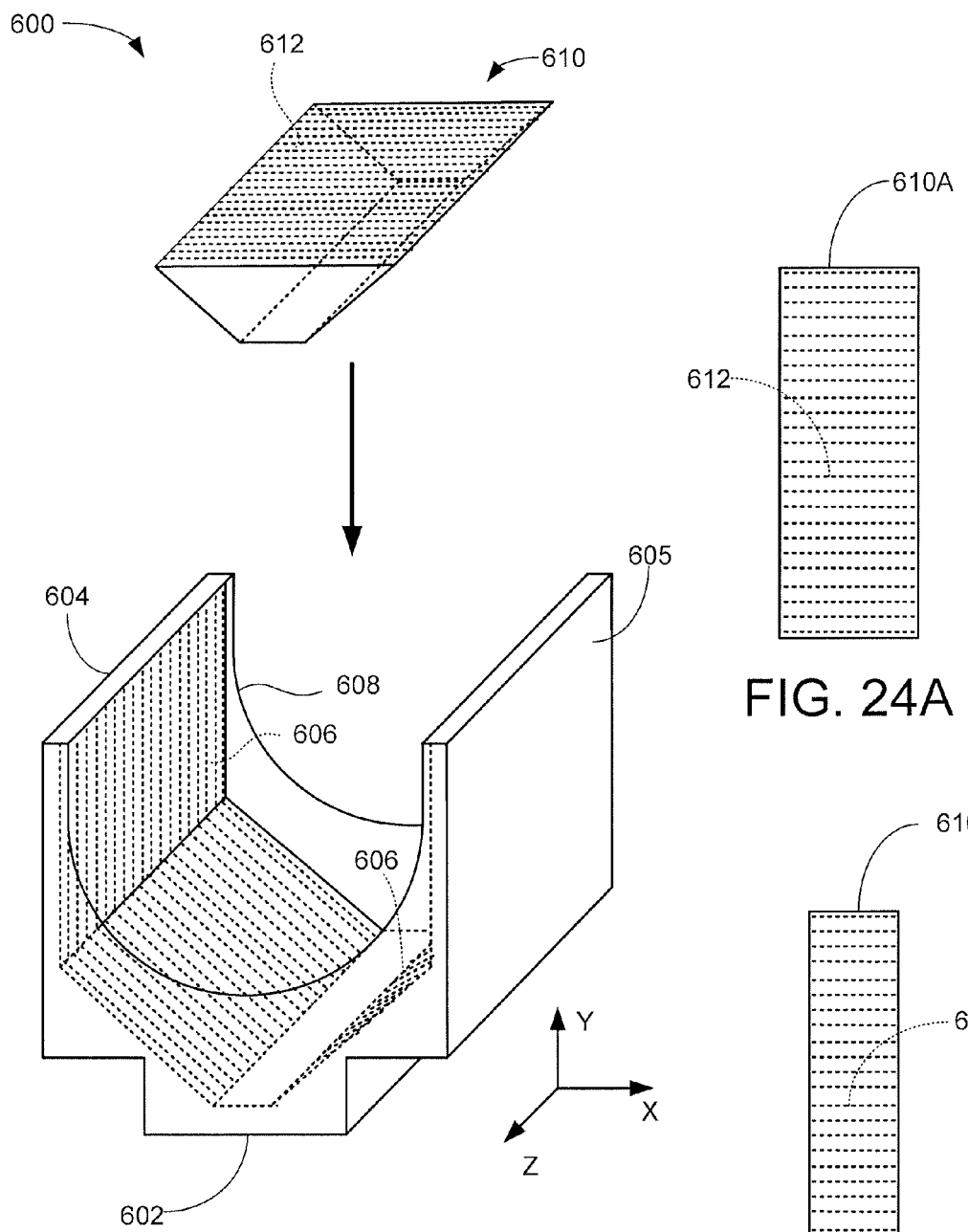
FIG. 23 shows another cassette assembly constructed and operated in accordance with some embodiments.
FIGS. 24A-24B are top plan views of different sized inserts that can be used to support different sized platters.

FIGS. 23-27 depict another embodiment for a cassette assembly 600 similar to the cassette assemblies discussed above. As best shown in FIG. 23, the cassette assembly 600 includes a base cassette 602 with opposing sidewalls 604, 605 each having a series of spaced apart grooves 606. The sidewall 604 includes a substantially vertical portion 604A and an angled portion 604B. The sidewall 605 includes a substantially vertical portion 605A and angled portion 605B. The grooves 606 extend along each of the vertical portions 604A, 605A and angled portions 604B, 605B. Openings 608 on each end of the base cassette 602 provide access clearance.

A substantially trapezoidal-shaped insert 610 is adapted for placement within a lower extent of the base cassette 602. The insert 610 includes spaced-apart grooves 612 adapted to support the lowermost peripheral edges of a set of platters. The angled portions 604B, 605B also support respective side edges of the platters.

The size of the insert 610 is adjusted to accommodate a particular platter diameter. FIG. 24A shows a first insert 610A adapted for a relatively larger platter, and FIG. 24B shows a second insert 610B adapted for a relatively smaller platter. Both inserts 610A, 610B can be alternately installed into the base cassette 602. While a press-fit is envisioned, various securement mechanisms as discussed above can be used to retain the inserts.

Figure 25:
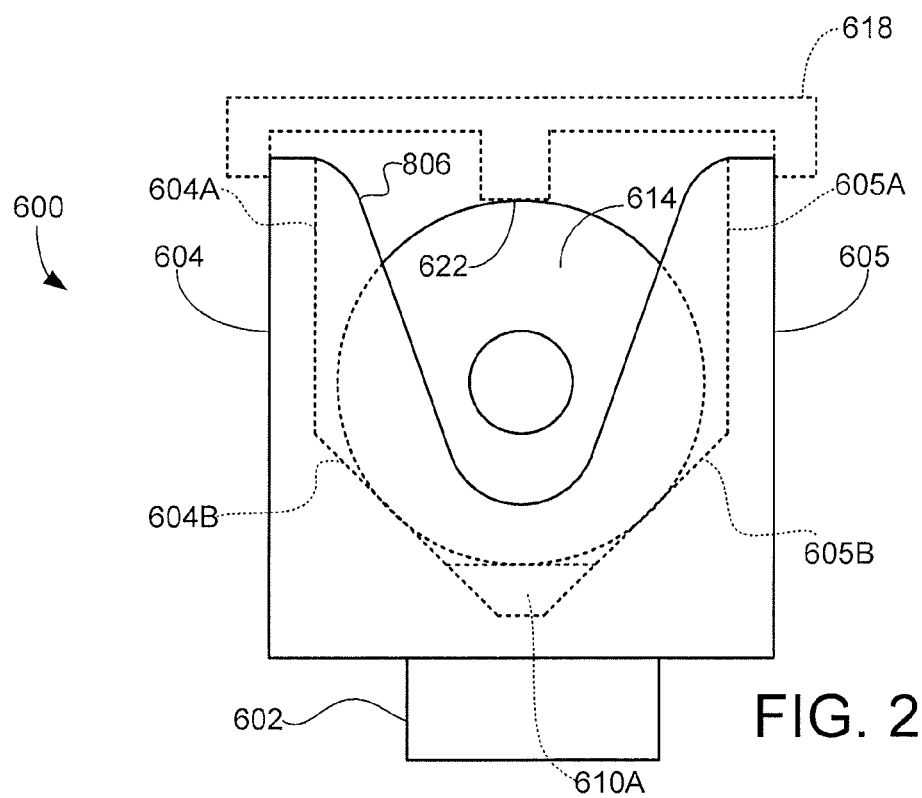
FIG. 25 shows use of the cassette assembly of FIG. 23 to support a set of platters having a first outermost diameter.
Figure 26:
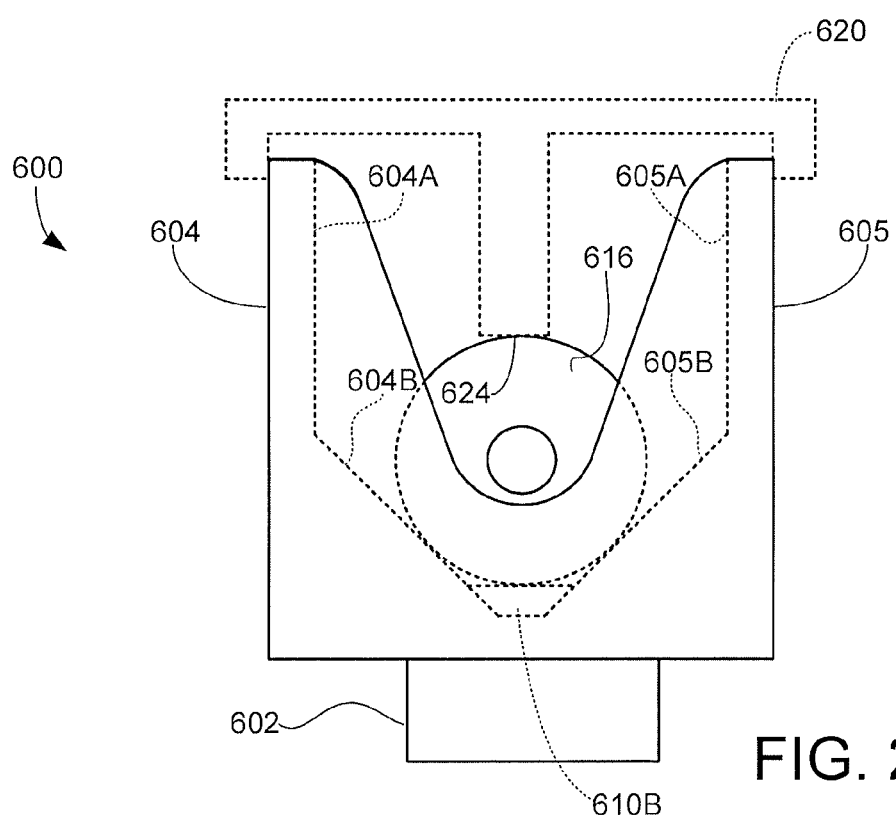
FIG. 26 shows use of the cassette assembly of FIG. 23 to support a different set of platters having a second outermost diameter.

FIG. 25 illustrates the use of the first insert 610A to support a first set of platters 614, and FIG. 26 illustrates the use of the second insert 610B to support a second set of platters 616. As desired, respective lids (top covers) 618, 620 can be affixed to the base cassette 602 to enclose the cassette assembly 600. Grooved projections 622, 624 can be provided to support the topmost peripheral edges of the respective sets of platters 614, 616 as shown. In some cases, the separation distance between the vertical portions 604A, 604B may nominally correspond to the diameter of the platters, in which case the platters are also supported by these portions as well.

Figure 27:
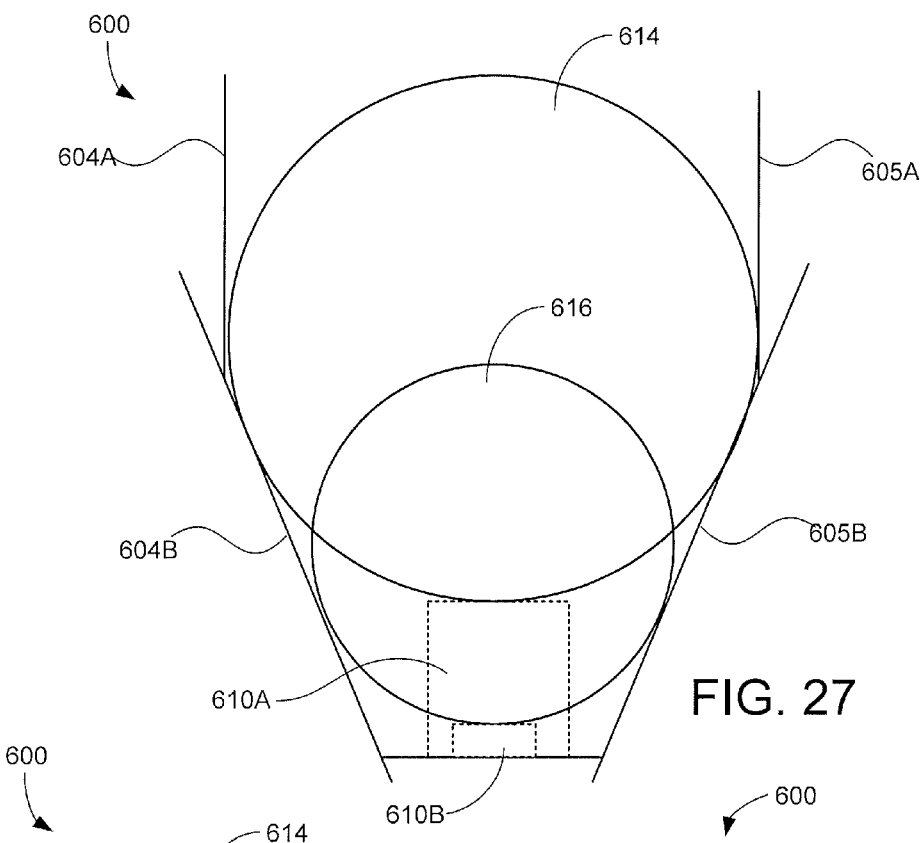
FIGS. 27-29 are schematic depictions of the cassette assembly of FIG. 23 in accordance with some embodiments.
Figure 28:
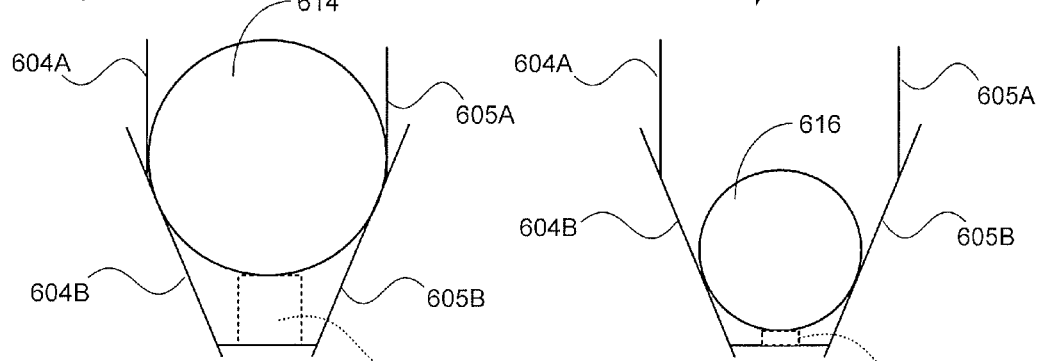
Figure 29:
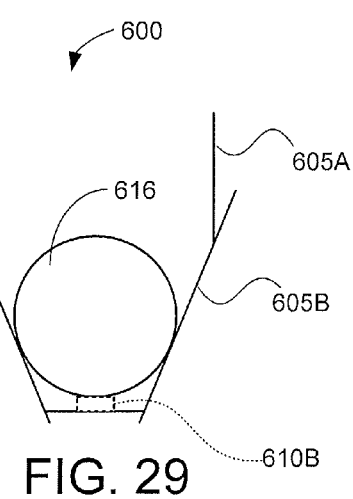

FIGS. 27-29 provide schematic depictions of the cassette assembly 600. The respective angles and lengths of the angled portions 604B, 605B can be selected to support the different sizes of platters 614, 616. It is contemplated that the cassette assembly 600 will provide sufficient bottom and side support of the respective platters to ensure secure confinement of the platters. As can be seen from FIGS. 27-29, while it is contemplated that the inserts 610A, 610B may be trapezoidal-shaped, such is not necessarily required.

It will now be appreciated that the various embodiments of the present disclosure can present a number of features useful in the art. By enlarging the size of a substrate for a magnetic recording disc from the standard sizes of 95 mm and 65 mm, enhanced data recording and read characteristics can be achieved over the entirety of the radial distance of a recording area of the discs formed from such substrates. Enhanced performance at the outermost extents of the recording media can be obtained.

Both standard and newly configured cassettes can be provided to accommodate a variety of different standard and non-standard sized platters (substrates and discs). This allows designers to quickly change to different platter dimensions and accommodate processing and shipment of the platters in a manufacturing (or other) process without the need to order or obtain new, replacement base cassettes adapted to the new size.

Since the base cassettes are already provided with sizes and shapes adapted for the existing manufacturing (or other) processes, compatibility with the existing processes will tend to be assured (e.g., compatibility with existing conveyors, end effectors, etc. will be maintained even in the presence of the inserts). If a removable attachment arrangement is used, the base cassettes can be temporarily relegated for use in supporting the new sized platters through the process until final, new cassettes are fabricated and implemented for the new size of platters. At this point, as desired the inserts can be removed and the base cassettes returned to service in supporting the originally sized platters for other products in the manufacturing flow. Alternatively, a different set of inserts can be installed to support still another non-standard sized platter.

While dimensions of 146.1 by 101 mm have been provided for a 3½ inch form factor disc and 101 by 73 mm have been provided for a 2½ inch form factor disc drive, it will be appreciated that small variations in these dimensions can be provided while still providing drives in these respective form factor classes.

Finally, while various embodiments presented herein have been in the environment of the manufacturing of data recording media, it will be appreciated that the various embodiments can be readily adapted to any number of other environments where platter-shaped members are manipulated, such as but not limited to semiconductor wafers.

It is to be understood that even though numerous characteristics and advantages of various embodiments of the present disclosure have been set forth in the foregoing description, this description is illustrative only, and changes may be made in detail, especially in matters of structure and arrangements of parts within the principles of the present disclosure to the full extent indicated by the broad general meaning of the terms wherein the appended claims are expressed.

What is claimed is:

1. A cassette assembly comprising:
a base cassette having a base and opposing first and second sidewalls, the first and second sidewalls having a first plurality of spaced-apart grooves configured to support an outermost perimeter of each of a first plurality of disc-shaped platters having a first diameter of nominally 95 millimeters, mm; and
opposing first and second inserts configured to contactingly engage the respective first and second sidewalls of the base cassette, the first and second inserts comprising a second plurality of spaced-apart grooves configured to, responsive to installation of the first and second inserts onto the base cassette, contactingly support an outermost perimeter of each of a second plurality of disc-shaped platters having a smaller, second diameter less than the first diameter; wherein each of the first and second sidewalls comprise at least one drainage hole configured to facilitate removal of fluid from an interior of the base cassette, and wherein each of the first and second inserts comprises an attachment hook configured for insertion through the associated at least one drainage hole to contactingly secure the respective first insert to the first sidewall and the second insert to the second sidewall.

2. The cassette assembly of claim 1, wherein the disc-shaped platters having the first diameter of nominally 95 mm are adapted for use in a hard disc drive (HDD) having a 3½ inch form factor, and the disc-shaped platters having the smaller second diameter are adapted for use in an HDD having a 2½ inch form factor.

3. The cassette assembly of claim 1, wherein the smaller, second diameter is nominally 67 mm, 68 mm, 69 mm, 70 mm, or 71 mm.

4. The cassette assembly of claim 1, wherein the smaller, second diameter is from about 65 mm to about 71.8 mm.

5. The cassette assembly of claim 1, wherein the smaller, second diameter is at least 2 mm less than the first diameter.

6. The cassette assembly of claim 1, wherein each of the first and second inserts comprises an attachment mechanism to attach the respective first insert to the first sidewall and the second insert to the second sidewall.

7. The cassette assembly of claim 1, wherein the first and second sidewalls each comprise a first portion that extends in a substantially orthogonal direction with respect to an upper base surface of the base and a second portion that extends at a non-orthogonal direction with respect to the upper base surface of the base.

8. The cassette assembly of claim 1, wherein each of the second plurality of grooves in the first and second inserts comprises a v-shaped groove formed by opposing first and second planar surfaces that converge at nominally 45 degrees to a maximum depth of the associated groove.

9. The cassette assembly of claim 1, wherein the base is rectilinear in shape and configured for transport along a conveyor system in a high volume manufacturing environment.

10. The cassette assembly of claim 1, wherein the base cassette further comprises opposing first and second end walls that extend between the first and second sidewalls.

11. The cassette assembly of claim 1, wherein the base cassette is characterized as a shipping cassette further comprising a cover configured to contactingly span the first and second sidewalls to enclose the first and second inserts and the disc-shaped platters having the second diameter.

12. A cassette assembly comprising:
a base cassette having a base and opposing first and second sidewalls, the first and second sidewalls having a first plurality of spaced-apart grooves configured to support an outermost perimeter of each of a first plurality of disc-shaped platters having a first diameter sized for use in a hard disc drive (HDD) having a 3½ inch form factor; and opposing first and second inserts configured to contactingly engage the respective first and second sidewalls of the base cassette to provide a second plurality of spaced-apart grooves configured to contactingly support an outermost perimeter of each of a second plurality of disc-shaped platters having a smaller, second diameter less than the first diameter sized for use in an HDD having a 2½ inch form factor; wherein each of the first and second sidewalls comprise at least one drainage hole configured to facilitate removal of fluid from an interior of the base cassette, and wherein each of the first and second inserts comprises an attachment hook configured for insertion through the associated at least one drainage hole to contactingly secure the respective first insert to the first sidewall and the second insert to the second sidewall.

13. The cassette assembly of claim 12, wherein the first diameter is nominally 95 millimeters, mm and the second diameter is from about 65 mm to about 72 mm.

14. The cassette assembly of claim 12, wherein the first diameter is nominally 95 mm and the smaller, second diameter is nominally 67 mm, 68 mm, 69 mm, 70 mm, or 71 mm.

15. The cassette assembly of claim 12, wherein the first diameter is nominally 95 mm and the smaller, second diameter is from about 66.9 mm to about 71.8 mm.

* * * * *